(12) United States Patent
Kim

(10) Patent No.: US 8,988,472 B2
(45) Date of Patent: Mar. 24, 2015

(54) SCAN DRIVING DEVICE AND DRIVING METHOD THEREOF

(71) Applicant: Samsung Display Co., Ltd., Yongin, Gyeonggi-Do (KR)

(72) Inventor: Tae-Jin Kim, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 196 days.

(21) Appl. No.: 13/712,760

(22) Filed: Dec. 12, 2012

(65) Prior Publication Data

US 2014/0043373 A1 Feb. 13, 2014

(30) Foreign Application Priority Data

Aug. 8, 2012 (KR) .................. 10-2012-0086932

(51) Int. Cl.
*G09G 5/10* (2006.01)
*G06G 3/02* (2006.01)
*G09G 3/20* (2006.01)
*G09G 5/00* (2006.01)
*G09G 3/32* (2006.01)
*G09G 3/36* (2006.01)
*G11C 19/28* (2006.01)
*G11C 19/18* (2006.01)

(52) U.S. Cl.
CPC .. *G06G 3/02* (2013.01); *G09G 3/20* (2013.01); *G09G 5/00* (2013.01); *G09G 3/3266* (2013.01); *G09G 3/3677* (2013.01); *G11C 19/28* (2013.01); *G11C 19/184* (2013.01); *G09G 2300/0417* (2013.01); *G09G 2310/0281* (2013.01); *G09G 2310/0291* (2013.01)
USPC .......................................... 345/690; 345/204

(58) Field of Classification Search
CPC .............. G09G 3/3233; G09G 3/3266; G09G 10/0267; G09G 10/0281; G09G 3/3674; G11C 19/28; G11C 19/284
USPC ........................................................ 345/100
See application file for complete search history.

(56) References Cited

U.S. PATENT DOCUMENTS

2012/0075259 A1* 3/2012 Chung .......................... 345/204
2013/0127809 A1* 5/2013 Han .............................. 345/211

FOREIGN PATENT DOCUMENTS

| KR | 10-2008-0015289 A | 2/2008 |
| KR | 10-2011-0043265 A | 4/2011 |
| KR | 10-2011-0132738 A | 12/2011 |
| KR | 10-2012-0028006 A | 3/2012 |

* cited by examiner

*Primary Examiner* — Lixi C Simpson
(74) *Attorney, Agent, or Firm* — Knobbe Martens Olson & Bear LLP

(57) ABSTRACT

A scan driving device and a driving method thereof are disclosed. The scan driving device includes a plurality of scan driving blocks, and each of the plurality of scan driving blocks includes a first transistor configured to transfer a clock signal inputted to a first clock signal input terminal to a first node according to a first input signal inputted to a first input signal input terminal; a second transistor configured to transfer a first power source voltage to a second node according to a voltage of the first node; and a third transistor configured to transfer the clock signal inputted to the first clock signal input terminal to an output terminal connected to a scan line according to the voltage of the fourth node. The scan driving blocks may also include a plurality of capacitor configured to store and/or change voltage at a plurality of nodes.

37 Claims, 7 Drawing Sheets

220_k

SCAN DRIVING DEVICE AND DRIVING METHOD THEREOF

CROSS-REFERENCE TO RELATED APPLICATION

This application claims priority to and the benefit of Korean Patent Application No. 10-2012-0086932 filed in the Korean Intellectual Property Office on Aug. 8, 2012, the entire contents of which are incorporated herein by reference.

BACKGROUND

1. Field

The present disclosure relates to a scan driving device and a driving method thereof, and more particularly, to a scan driving device using an N-type oxide thin film transistor and a driving method thereof.

2. Description of the Related Technology

Recently, in the display apparatus industry, technologies relating to high-speed driving and a large-sized screen have received attention. Since an amorphous silicon thin film transistor (amorphous-Si TFT) has low mobility and low current driving capacity, the amorphous-Si TFT is not suitable for implementing in high-speed driving and a large-sized screen. Since a low temperature poly-silicon (LTPS) thin film transistor has high mobility, but has a low crystallization speed of the LTPS and a defect problem is generated during an LTPS crystallization process, it is difficult to implement a large-sized screen. Since an N-type low temperature polysilicon thin film transistor has excellent current driving capacity, but is sensitive to noise, a P-type low temperature polysilicon thin film transistor which is insensitive to noise is frequently used.

Recently, an oxide thin film transistor (Oxide TFT), which has oxide such as amorphous indium-gallium-zinc-oxide (IGZO), zinc-oxide (ZnO), and titanium oxide (TiO) as an active layer, has been recognized as a substitute element of the amorphous silicon thin film transistor and the low temperature polysilicon thin film transistor. The oxide thin film transistor has high mobility as compared with the amorphous silicon thin film transistor and has uniformity as an element characteristic which is similar to the amorphous silicon thin film transistor. Further, the oxide thin film transistor may be applied to various kinds of display apparatuses such as a transparent display apparatus, vehicle glass, building glass, and goggles, due to its transparent and flexible characteristics.

Since the characteristics and kind of material of the N-type oxide thin film transistor are excellent as compared with the characteristics and kind of material of the P-type oxide thin film transistor, the N-type oxide thin film transistor is suitable for implementing the high-speed driving and the large-sized screen of the display apparatus. The N-type oxide thin film transistor has a negative threshold voltage characteristic.

Scan driving devices of display apparatuses which have been developed in the related art are P-type scan driving devices using the P-type low temperature polysilicon thin film transistor, which has aa positive threshold voltage characteristic. Accordingly, it is difficult to apply the N-type oxide thin film transistor having the negative threshold voltage characteristic to the P-type scan driving device which has been developed in the related art.

The above information disclosed in this Background section is only for enhancement of understanding of the background of the invention and therefore it may contain information that does not form the prior art that is already known in this country to a person of ordinary skill in the art.

SUMMARY OF CERTAIN INVENTIVE ASPECTS

The present disclosure describes a scan driving device using an N-type oxide thin film transistor and a driving method thereof.

An exemplary embodiment provides a scan driving device including a plurality of scan driving blocks each of which includes: a first transistor configured to transfer a clock signal inputted to a first clock signal input terminal to a first node according to a first input signal inputted to a first input signal input terminal; a second transistor configured to transfer a first power source voltage to a second node according to a voltage of the first node; a first capacitor connected between the second node and a second clock signal input terminal to change a voltage of the second node according to a clock signal inputted to the second clock signal input terminal; a second capacitor connected between the second node and a third node to change a voltage of the third node according to a voltage change of the second node; a third capacitor connected between the third node and a fourth node to change a voltage of the fourth node according to a voltage change of the third node; and a third transistor configured to transfer the clock signal inputted to the first clock signal input terminal to an output terminal connected to a scan line according to the voltage of the fourth node.

The scan driving device may further include a fourth transistor transferring a second power source voltage to the output terminal according to a clock signal inputted to a third clock signal input terminal.

The scan driving device may further include a fourth capacitor connected between the output terminal and the second power source voltage to store a voltage of an output signal outputted to the output terminal.

The scan driving device may further include a fifth transistor configured to transfer a third power source voltage to the fourth node according to a clock signal inputted to the third clock signal input terminal.

The scan driving device may further include a sixth transistor configured to transfer the first power source voltage to the first node according to an initial signal.

The scan driving device may further include a seventh transistor configured to transfer the first power source voltage to the first node according to a second input signal inputted to the second input signal input terminal.

The scan driving device may further include a fifth capacitor connected between the first node and the first power source voltage to store the voltage of the first node.

The scan driving device may further include an eighth transistor configured to transfer the first power source voltage to the third node according to a clock signal inputted to the third clock signal input terminal.

At least one of the first transistor, the second transistor, the third transistor, the fourth transistor, the fifth transistor, the sixth transistor, the seventh transistor, and the eighth transistor may be an N-type oxide thin film transistor.

The first power source voltage may be a logic high-level voltage, the second power source voltage is a logic low-level voltage, and the third power source voltage may be a logic low-level voltage lower than the second power source voltage.

The plurality of scan driving blocks comprises a plurality of first scan driving blocks and a second plurality of scan driving blocks, wherein, in the first plurality of scan blocks, the first clock signal is inputted to the first clock signal input terminal, the second clock signal is inputted to the second clock signal input terminal, and the third clock signal is inputted to the third clock signal input terminal; and wherein, in the second plurality of scan driving blocks, a fourth clock signal is inputted to the first clock signal input terminal, the third clock signal is inputted to the second clock signal input terminal, and the second clock signal is inputted to the third clock signal input terminal.

The output signal of one of the first plurality of scan driving blocks comprises the input to the first input signal input terminal of one of the second plurality of scan driving blocks, and the output signal of one of the second plurality of scan driving blocks comprises the input to the second input signal input terminal of one of the first plurality of scan driving blocks.

The output signal of one of the second plurality of second scan driving blocks comprises, the input to the first input signal input terminal of one of the first plurality of scan driving blocks, and the output signal of one of the first plurality of scan driving blocks is inputted to the second input signal input terminal of one of second the plurality of scan driving blocks.

The first clock signal and the second clock signal may have the same cycle, the third clock signal may be a signal shifted by a duty of the second clock signal, and the fourth clock signal may be a signal shifted by a duty of the first clock signal.

The second clock signal may be a signal having a voltage range larger than the first clock signal, and the third clock signal may be a signal having a voltage range larger than the fourth clock signal.

The scan driving device may further include an eighth transistor configured to transfer the first power source voltage to the third node according to the initial signal.

The scan driving device may further include a ninth transistor configured to transfer a clock signal inputted to a fourth clock signal input terminal to the third node according to a first input signal inputted to the first input signal input terminal.

The scan driving device may further include a tenth transistor configured to transfer the third power source voltage to the fourth node according to the initial signal.

The scan driving device may further include an eleventh transistor configured to transfer the second power source voltage to the output terminal according to the initial signal.

At least one of the first transistor, the second transistor, the third transistor, the fourth transistor, the fifth transistor, the sixth transistor, the seventh transistor, the eighth transistor, the ninth transistor, the tenth transistor, and the eleventh transistor may be an N-type oxide thin film transistor.

The first power source voltage may be a logic high-level voltage, the second power source voltage is a logic low-level voltage, and the third power source voltage may be a logic low-level voltage lower than the second power source voltage.

The scan driving device of claim 19, wherein the plurality of scan driving blocks comprises a plurality of first scan driving blocks and a second plurality of scan driving blocks, wherein in the plurality of first scan driving blocks, the first clock signal is inputted to the first clock signal input terminal, the second clock signal is inputted to the second clock signal input terminal, the third clock signal is inputted to the third clock signal input terminal, and the fourth clock signal is inputted to the fourth clock signal input terminal, and wherein, in the second plurality of scan driving blocks, the fourth clock signal is inputted to the first clock signal input terminal, the third clock signal is inputted to the second clock signal input terminal, the second clock signal is inputted to the third clock signal input terminal, and the first clock signal is inputted to the fourth clock signal input terminal.

The output signal of one of the first plurality of scan driving blocks comprises the input to the first input signal input terminal of one of the second plurality of scan driving blocks, and the output signal of one of the second plurality of scan driving blocks comprises the input to the second input signal input terminal of one of the first plurality of scan driving blocks.

The output signal of one of the second plurality of second scan driving blocks comprises, the input to the first input signal input terminal of one of the first plurality of scan driving blocks, and the output signal of one of the first plurality of scan driving blocks is inputted to the second input signal input terminal of one of second the plurality of scan driving blocks.

The first clock signal and the second clock signal may have the same cycle, the third clock signal may be a signal shifted by a duty of the second clock signal, and the fourth clock signal may be a signal shifted by a duty of the first clock signal.

The second clock signal may be a signal having a voltage range larger than the first clock signal, and the third clock signal may be a signal having a voltage range larger than the fourth clock signal.

Another exemplary embodiment provides a method of driving a scan driving device including a plurality of scan driving blocks each of which includes a first transistor transferring a clock signal inputted to a first clock signal input terminal to a first node, a second transistor having a gate electrode connected to the first node to transfer a first power source voltage of an on voltage to a second node, a first capacitor connected between the second node and a second clock signal input terminal, a second capacitor connected between the second node and a third node, a third transistor having a gate electrode connected to the fourth node to transfer the clock signal inputted to the first clock signal input terminal to an output terminal connected to a scan line, the method, including: applying the first power source voltage to the first node, the second node, and the third node; applying a third power source voltage of an off voltage to the fourth node; and outputting a second power source voltage of an off voltage through the output terminal.

The outputting of the second power source voltage of the off voltage through the output terminal may include turning on a fourth transistor according to a clock signal inputted to a third clock signal input terminal connected to a gate electrode of the fourth transistor transferring the second power source voltage to the output terminal.

The applying of the third power source voltage of the off voltage to the fourth node may include turning on a fifth transistor according to a clock signal inputted to a third clock signal input terminal connected to a gate electrode of the fifth transistor transferring the third power source voltage to the fourth node.

The applying of the first power source voltage to the first node, the second node, and the third node may include turning on the first transistor according to a first input signal inputted to a first input signal input terminal connected to a gate electrode of the first transistor; turning on the second transistor by changing a voltage of the second node according to a voltage change of a clock signal inputted to the second clock signal input terminal; and turning on an eighth transistor according to a clock signal inputted to a third clock signal input terminal connected to a gate electrode of the eighth transistor transferring the first power source voltage to the third node.

The driving method of a scan driving device may further include outputting a clock signal of an on voltage inputted to the first clock signal input terminal through the output terminal, as a clock signal inputted to the first clock signal input terminal and a clock signal inputted to the second clock signal input terminal are changed to the on voltages, and a clock signal inputted to the third clock signal input terminal is changed to the off voltage.

The outputting of the clock signal inputted to the first clock signal input terminal through the output terminal may include changing the voltage of the second node as the clock signal inputted to the second clock signal input terminal is changed to the on voltage; changing the voltage of the third node as the voltage of the second node is changed; and changing the voltage of the fourth node to the on voltage as the voltage of the third node is changed.

The driving method of a scan driving device may further include turning on a seventh transistor according to a second input signal inputted to the second input signal input terminal connected to a gate electrode of the seventh transistor transferring the first power source voltage to the first node; and turning on the fourth transistor and the fifth transistor according to a clock signal inputted to the third clock signal input terminal and outputting the second power source voltage through the output terminal.

The applying of the first power source voltage to the first node, the second node, and the third node may include turning on a sixth transistor according to an initial signal inputted to a gate electrode of the sixth transistor transferring the first power source voltage to the first node; and turning on an eighth transistor according to a clock signal inputted to a third clock signal input terminal connected to a gate electrode of the eighth transistor transferring the first power source voltage to the third node.

The applying of the first power source voltage to the first node, the second node, and the third node may include turning on a sixth transistor according to an initial signal inputted to a gate electrode of the sixth transistor transferring the first power source voltage to the first node; and turning on an eighth transistor according to an initial signal inputted to a gate electrode of the eighth transistor transferring the first power source voltage to the third node.

The applying of the third power source voltage of the off voltage to the fourth node may include turning on a tenth transistor according to an initial signal inputted to a gate electrode of the tenth transistor transferring the third power source voltage to the fourth node.

The outputting of the second power source voltage of the off voltage through the output terminal may include turning on an eleventh transistor according to an initial signal inputted to a gate electrode of the eleventh transistor transferring the second power source voltage to the output terminal.

As shown in some exemplary embodiments, a scan driving device using an N-type oxide thin film transistor is used to improve high-speed driving performance of a display apparatus.

DETAILED DESCRIPTION

Figure 1:
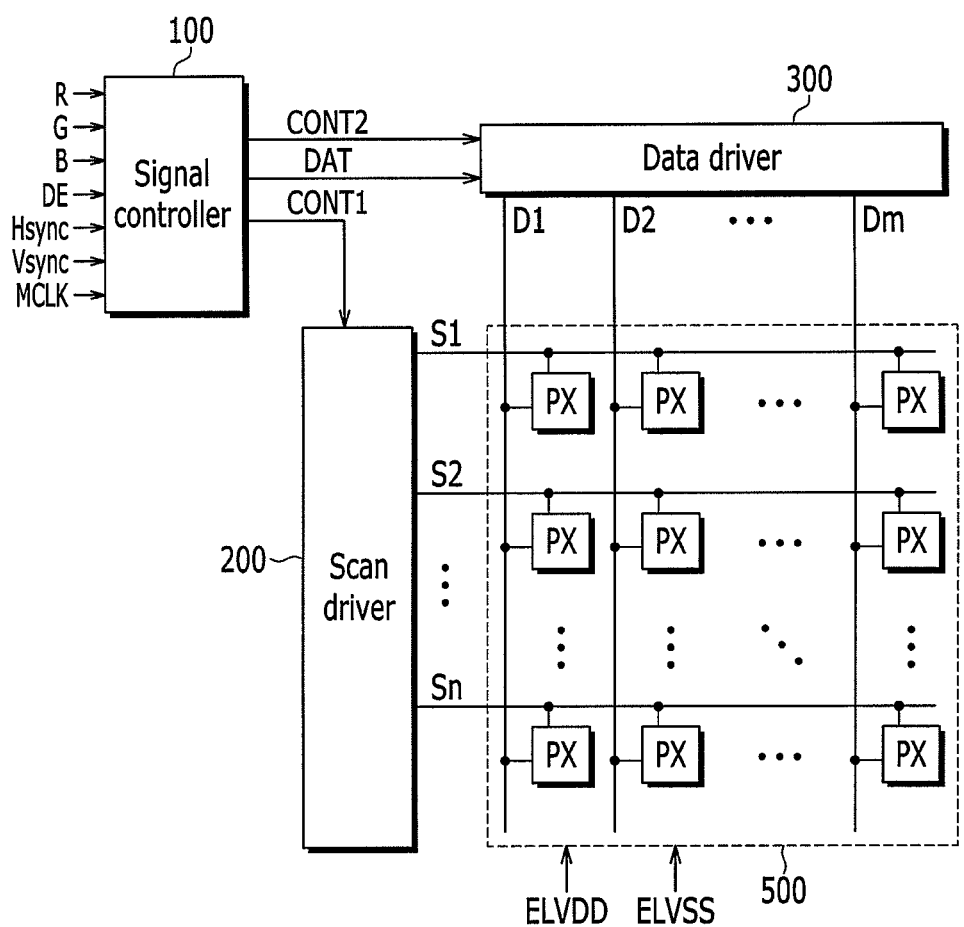
FIG. 1 is a block diagram illustrating a display.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

Further, in exemplary embodiments, like reference numerals designate like elements having the same configuration, a first exemplary embodiment is representatively described, and in other exemplary embodiments, only the configuration which is different different from the first exemplary embodiment is described.

The drawings and description are to be regarded as illustrative in nature and not restrictive. Like reference numerals designate like elements throughout the specification.

Throughout this specification and the claims that follow, when it is described that an element is "coupled" to another element, the element may be "directly coupled" to the other element or "electrically coupled" to the other element through a third element. Further, unless explicitly described to the contrary, the word "comprise" and variations such as "comprises" or "comprising", will be understood to imply the inclusion of stated elements but not the exclusion of any other elements.

FIG. 1 is a block diagram illustrating a display apparatus.

Referring to FIG. 1, a display apparatus includes a signal controller 100, a scan driver 200, a data driver 300, and a display unit 500.

The signal controller 100 receives image signals R, G, and B inputted from an external apparatus and an input control signal controlling a display thereof. The image signals R, G, and B store luminance information on each pixel PX, and the luminance has a predetermined number of, for example, 1024 ($=2^{10}$), 256($=2^8$) or 64($=2^6$) grays. An example of the input control signal includes a vertical synchronization signal Vsync and a horizontal synchronization signal Hsync, a main clock MCLK, and a data enable signal DE.

The signal controller 100 processes the input image signals R, G, and B based on the input image signals R, G, and B and the input control signal so as to be suitable for operation of the display unit 500 and the data driver 300. The signal controller 100 generates a scan control signal CONT1, a data control signal CONT2, and an image data signal DAT. The signal controller 100 transfers the scan control signal CONT1 to the scan driver 200. The signal controller 100 transfers the data control signal CONT2 and the image data signal DAT to the data driver 300.

The display unit 500 includes a plurality of scan lines S1-Sn, a plurality of data lines D1-Dm, and a plurality of pixels PX which is connected to the plurality of signal lines S1-Sn and D1-Dm and arranged in a substantially matrix form. The plurality of scan lines S1-Sn extend in a substantially row direction and are substantially almost parallel to each other. The plurality of data lines D1-Dm extends in a substantially column direction and are substantially parallel to each other. The plurality of pixels PX of the display unit 500 also receive a first power source voltage ELVDD and a second power source voltage ELVSS.

The scan driver 200 is connected to the plurality of scan lines S1-Sn and applies to the plurality of scan lines S1-Sn a scan signal comprising a gate-on voltage Von which turns on application of the data signal for the pixel PX and/or a gate-off voltage Voff which turns off the application, according to the scan control signal CONT1.

The scan control signal CONT1 includes a scan start signal SSP, a clock signal SCLK, an initial signal SINIT, and the like. The scan start signal SSP is a signal generating a first scan signal for displaying an image of one frame. The clock signal SCLK is a synchronization signal for applying the scan signals to the plurality of scan lines S1-Sn in sequence. The initial signal SINIT is a signal for applying the scan signals of the gate-off voltage to the plurality of scan lines S1-Sn at the same time.

The data driver 300 is connected to the plurality of data lines D1-Dm and selects a gray voltage according to the image data signal DAT. The data driver 300 applies the gray voltage selected according to the data control signal CONT2 as a data signal to the plurality of data lines D1-Dm.

The drivers 100, 200, and 300 each may be installed outside a pixel area, and may be contained on at least one integrated circuit chip, installed on a flexible printed circuit film, attached to the display unit 500 in a tape carrier package (TCP) form, installed on a separate printed circuit board, or integrated outside the pixel area together with the signal lines S1-Sn and D1-Dm.

Figure 2:
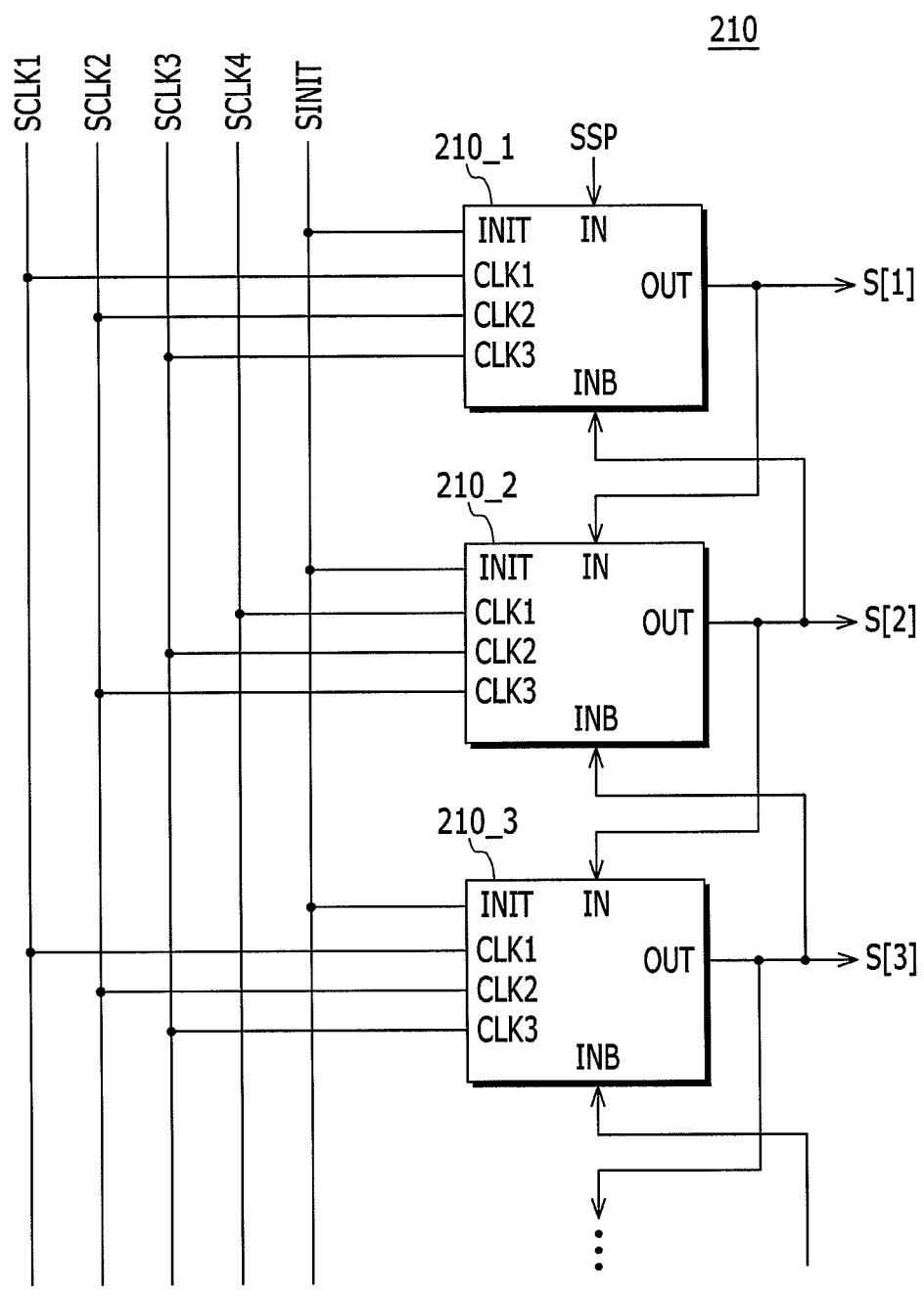
FIG. 2 is a block diagram illustrating a configuration of a scan driving device.

FIG. 2 is a block diagram illustrating a configuration of a scan driving device.

Referring to FIG. 2, a scan driving device 210 includes a plurality of scan driving blocks 210_1, 210_2, 210_3, . . . which are sequentially arranged. Each of the scan driving blocks 210_1, 210_2, 210_3, . . . receives input signals, and generates scan signals S[1], S[2], S[3], . . . which are transferred to the plurality of scan lines S1-Sn, respectively.

The plurality of scan driving blocks 210_1, 210_2, 210_3, . . . each includes an initial signal input terminal INIT, a first clock signal input terminal CLK1, a second clock signal input terminal CLK2, a third clock signal input terminal CLK3, a first input signal input terminal IN, a second input signal input terminal INB, and an output terminal OUT.

An initial signal SINIT is inputted to the initial signal input terminal INIT of each of the plurality of scan driving blocks 210_1, 210_2, 210_3, . . . .

In the odd numbered scan driving blocks 210_1, 210_3, . . . a first clock signal SCLK1 is inputted to the first clock signal input terminal CLK1, a second clock signal SCLK2 is inputted to the second clock signal input terminal CLK2, and a third clock signal SCLK3 is inputted to the third clock signal input terminal CLK3.

In the even numbered scan driving blocks 210_2, . . . , a fourth clock signal SCLK4 is inputted to the first clock signal input terminal CLK1, the third clock signal SCLK3 is inputted to the second clock signal input terminal CLK2, and the second clock signal SCLK2 is inputted to the third clock signal input terminal CLK3.

The output terminals OUT of the plurality of scan driving blocks 210_1, 210_2, 210_3, . . . are connected to the plurality of scan lines S1-Sn. Each of the scan driving blocks 210_1, 210_2, 210_3, . . . outputs, via output terminal OUT, the scan signals S[1], S[2], S[3], . . . which are generated according to signals inputted to the initial signal input terminal INIT, the plurality of clock signal input terminals CLK1, CLK2, and CLK3, the first input signal input terminal IN, and the second input signal input terminal INB.

The scan start signal SSP is inputted to the first input signal input terminal IN of the first scan driving block 210_1. The scan signal outputted through output terminal OUT of a scan driving block is inputted to the first input signal input terminal IN of the next sequential scan driving blocks. For example, scan signal S[1] is inputted into the first input signal input terminal IN of scan driving block 210_2, and scan signal S[2] is inputted into the first input signal input terminal IN of scan driving block 210_3. In this way, the scan signal of odd numbered scan driving blocks is inputted to the first input signal input terminals IN of the next sequential even numbered scan driving blocks. and scan signals outputted through output terminals OUT of the even numbered scan driving blocks are inputted to the first input signal input terminals IN of the next sequential odd numbered scan driving blocks.

Scan signals outputted through output terminals OUT of scan driving blocks are inputted to the second input signal input terminals INB of the previously numbered scan driving block. For example, the scan signal S[2] is inputted in to the second input signal input terminal INB of scan driving block 210_1, and scan signal S[3] is inputted in to the second input signal input terminal INB of scan driving block 210_2. In this way, scan signals outputted through output terminals OUT of odd numbered scan driving blocks are inputted to the second input signal input terminals INB of immediately preceeding even numbered scan driving blocks and scan signals outputted through output terminals OUT of the even numbered scan driving blocks are inputted to the second input signal input terminals INB of the immediately preceeding odd numbered scan driving blocks.

Figure 3:
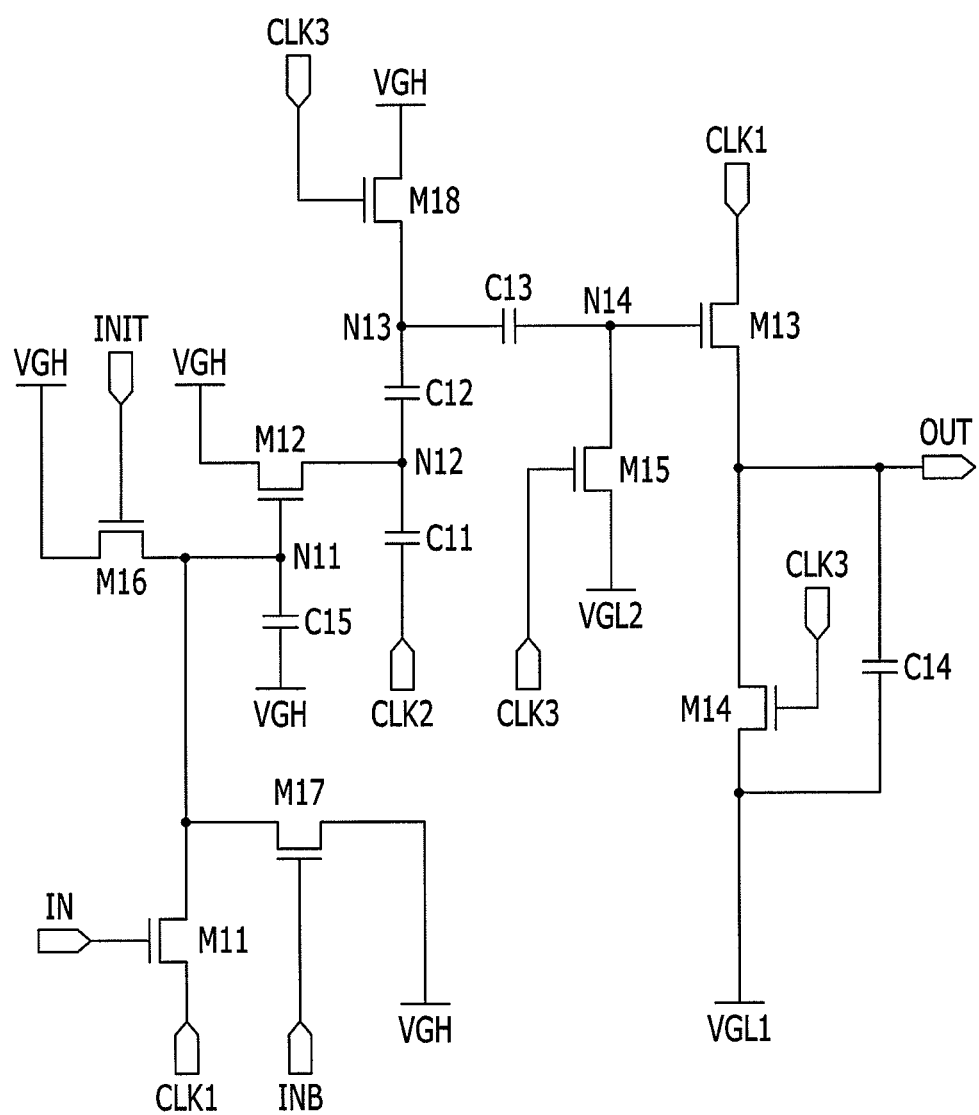
FIG. 3 is a circuit diagram illustrating a scan driving block included in the scan driving device of FIG. 2.

FIG. 3 is a circuit diagram illustrating a scan driving block according to the exemplary embodiment included in the scan driving device of FIG. 2.

Referring to FIG. 3, a scan driving block 210_k includes a plurality of transistors M11, M12, M13, M14, M15, M16, M17, and M18 and a plurality of capacitors C11, C12, C13, C14, and C15.

A first transistor M11 includes a gate electrode connected to the first input signal input terminal IN, one electrode connected to the first clock signal input terminal CLK1, and the other electrode connected to a first node N11. The first transistor M11 transfers a clock signal inputted to the first clock signal input terminal CLK1 to the first node N11 according to a first input signal inputted to the first input signal input terminal IN.

A second transistor M12 includes a gate electrode connected to the first node N11, one electrode connected to a first power source voltage VGH, and the other electrode connected to a second node N12. The second transistor M12 transfers the first power source voltage VGH to the second node N12 according to a voltage of the first node N11.

A third transistor M13 includes a gate electrode connected to a fourth node N14, one electrode connected to the first clock signal input terminal CLK1, and the other electrode connected to the output terminal OUT. The third transistor M13 transfers the clock signal inputted to the first clock signal input terminal CLK1 to the output terminal OUT according to a voltage of the fourth node N14.

A fourth transistor M14 includes a gate electrode connected to the third clock signal input terminal CLK3, one electrode connected to a second power source voltage VGL1, and the other electrode connected to the output terminal OUT. The fourth transistor M14 transfers the second power source voltage VGL1 to the output terminal OUT according to a clock signal inputted to the third clock signal input terminal CLK3.

A fifth transistor M15 includes a gate electrode connected to the third clock signal input terminal CLK3, one electrode connected to a third power source voltage VGL2, and the other electrode connected to the fourth node N14. The fifth transistor M15 transfers the third power source voltage VGL2 to the fourth node N14 according to a clock signal inputted to the third clock signal input terminal CLK3.

A sixth transistor M16 includes a gate electrode connected to the initial signal input terminal INIT, one electrode connected to the first power source voltage VGH, and the other electrode connected to the first node N11. The sixth transistor M16 transfers the first power source voltage VGH to the first node N11 according to the initial signal SINIT inputted to the initial signal input terminal INIT.

A seventh transistor M17 includes a gate electrode connected to the second input signal input terminal INB, one electrode connected to the first power source voltage VGH, and the other electrode connected to the first node N11. The seventh transistor M17 transfers the first power source voltage VGH to the first node N11 according to the second input signal inputted to the second input signal input terminal INB.

A eighth transistor M18 includes a gate electrode connected to the third clock signal input terminal CLK3, one electrode connected to the first power source voltage VGH, and the other electrode connected to the third node N13. The eighth transistor M18 transfers the first power source voltage VGH to the third node N13 according to the clock signal inputted to the third clock signal input terminal CLK3.

A first capacitor C11 includes one electrode connected to the second clock signal input terminal CLK2 and the other electrode connected to the second node N12. The first capacitor C11 changes the voltage of the second node N12 according to the clock signal inputted to the second clock signal input terminal CLK2.

A second capacitor C12 includes one electrode connected to the second node N12 and the other electrode connected to the third node N13. The second capacitor C12 changes the voltage of the third node N13 according to a voltage change of the second node N12.

A third capacitor C13 includes one electrode connected to the third node N13 and the other electrode connected to the fourth node N14. The third capacitor C13 changes the voltage of the fourth node N14 according to a voltage change of the third node N13.

A fourth capacitor C 14 includes one electrode connected to the second power source voltage VGL1 and the other electrode connected to the output terminal OUT. The fourth capacitor C14 stores the voltage of the output signal outputted to the output terminal OUT.

A fifth capacitor C15 includes one electrode connected to the first power source voltage VGH and the other electrode connected to the first node N11. The fifth capacitor C15 stores the voltage of the first node N11.

The plurality of transistors M11, M12, M13, M14, M15, M16, M17, and M18 may be N-type oxide thin film transistors. A gate-on voltage which turns on the N-type oxide thin film transistor is a logic high-level voltage, and a gate-off voltage which turns off the N-type oxide thin film transistor is a logic low-level voltage.

The first power source voltage VGH is a logic high-level voltage, the second power source voltage VGL1 is a logic low-level voltage, and the third power source voltage VGL2 is a logic low-level voltage lower than the second power source voltage VGL1.

Figure 4:
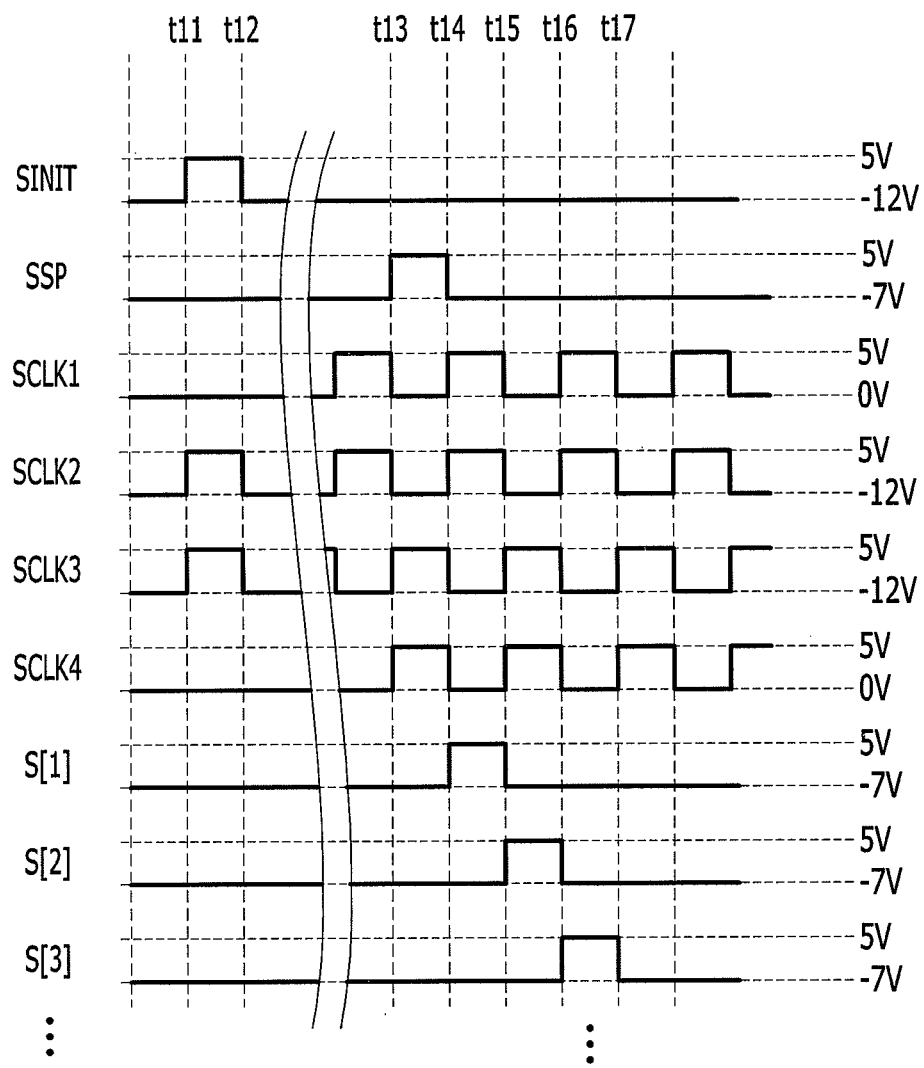
FIG. 4 is a timing diagram for describing a driving method of the scan driving device of FIG. 2.

FIG. 4 is a timing diagram for describing a driving method of the scan driving device of FIG. 2.

Referring to FIGS. 2 through 4, the scan driving device 210 is driven according to an initial period (period of t11 to t12) when a node voltage of each of the plurality of scan driving blocks 210_1, 210_2, 210_3, . . . is initialized, and a scan period (a period after t13) when the scan signals S[1], S[2], S[3], . . . of the gate-on voltage are outputted in sequence.

For convenience of the description, it is assumed that an on voltage of the initial signal SINT is 5 V and an off voltage is −12 V. It is also assumed that on voltages of the scan start signal SSP and the scan signals S[1], S[2], S[3], . . . are 5 V and off voltages are −7 V, that on voltages of the first clock signal SCLK1 and the fourth clock signal SCLK4 are 5 V, and off voltages are 0 V, and that on voltages of the second clock signal SCLK2 and the third clock signal SCLK3 are 5 V, and off voltages are −12 V. Further, it is assumed that the first power source voltage VGH is 5 V, the second power source voltage VGL1 is −7 V, and the third power source voltage VGL2 is −10 V. These assumed voltages are merely exemplary, and are not intended to be limiting in any way. Other on and off voltages may be chosen based on the desired design and operation of the scan driving device and associated display.

In an initial period (period of t11 to t12), the initial signal SINIT, the second clock signal SCLK2 and the third clock signal SCLK3 are applied with the on voltages to their respective inputs of the plurality of scan driving blocks 210_1, 210_2, 210_3 . . . . The fourth transistor M14, the fifth transistor M15, the sixth transistor M16, and the eighth transistor M18 are turned on. The first power source voltage VGH is transferred to the first node N11 through the turned-on sixth transistor M16. The second transistor M12 is turned on by the voltage of the first node N11, and the first power source voltage VGH is transferred to the second node N12. The first power source voltage VGH is transferred to the third node N13 through the turned-on eighth transistor M18. Voltages of the first node N11, the second node N12, and the third node N13 are initialized to 5 V. In addition, the third power source voltage VGL2 is transferred to the fourth node N14 through the turned-on fifth transistor M15. The voltage of the fourth node N14 becomes −10 V and completely turns off the third transistor M13. The second power source voltage VGL1 is transferred to the output terminal OUT through the turned-on fourth transistor M14, and the scan signal of the gate-off voltage of −7 V is outputted through the output terminal OUT.

In the initial period (period of t11 to t12), since voltage levels of the clock signals inputted to the plurality of clock signal input terminal CLK1, CLK2, and CLK3 of the odd numbered scan driving blocks 210_1, 210_3, . . . and the even numbered scan driving blocks 210_2, . . . are the same as each other, the odd numbered scan driving blocks 210_1, 210_3, . . . and the even numbered scan driving blocks 210_2, . . . equally operate to output the scan signal of the gate-off voltage of −7 V at the same time.

In the scan period (period after t13), the first clock signal SCLK1 and the second clock signal SCLK2 have the same cycle. In this case, the third clock signal SCLK3 is a signal shifted by a period of the second clock signal SCLK2, and the fourth clock signal SCLK4 is a signal shifted by a period of the first clock signal SCLK1. Further, the second clock signal SCLK2 has a voltage range larger than the first clock signal SCLK1, and the third clock signal SCLK3 has a voltage range larger than the fourth clock signal SCLK4. The initial signal SINIT for the scan period is maintained at an off voltage of −12 V.

First, an operation of a first scan driving block 210_1 will be described.

In a period of t13 to t14, the scan start signal SSP of the on voltage is applied to the first input signal input terminal IN as a first input signal. In this case, the first clock signal SCLK1 and the second clock signal SCLK2 are the off voltages, and the third clock signal SCLK3 and the fourth clock signal SCLK4 are the on voltages. As the scan start signal SSP with the on voltage is applied to the first input signal input terminal IN, the first transistor M11 is turned on and the first clock signal SCLK1 of 0 V is transferred to the first node N11. In this case, as the second clock signal SCLK2 is changed from 0 V to −12 V, the voltage of the second node N12 is lowered by −12 V by coupling due to the first capacitor C11, and the second transistor M12 is turned on by a difference between gate-source voltages. The first power source voltage VGH is transferred to the second node N12 through the turned-on second transistor M12. The voltage of the second node N12 becomes 5 V. The eighth transistor M18 is turned on by the third clock signal SCLK3, and the first power source voltage VGH is transferred to the third node N13. The voltage of the third node N13 becomes 5 V. The fifth transistor M15 is turned on by the third clock signal SCLK3, and the third power source voltage VGL2 is transferred to the fourth node N14. The voltage of the fourth node N14 becomes −10 V. The third transistor M13 is maintained in the completely turned-off state. The fourth transistor M14 is turned on by the third clock signal SCLK3, and the second power source voltage VGL2 is transferred to the output terminal OUT. A scan signal S[1] of the gate-off voltage of −7 V is outputted through the output terminal OUT.

In a period of t14 to t15, the first clock signal SCLK1 and the second clock signal SCLK2 are applied with the on voltages, and the third clock signal SCLK3 and the fourth clock signal SCLK4 are applied with the off voltages. As the second clock signal SCLK2 is changed from −12 V to 5 V, the voltage of the second node N12 is changed from 5 V to 22 V by coupling due to the first capacitor C11. As the voltage of the second node N12 is changed from 5 V to 22 V, the voltage of the third node N13 is changed from 5 V to 22 V by coupling due to the second capacitor C12. As the voltage of the third node N13 is changed from 5 V to 22 V, the voltage of the fourth node N14 is changed from −10 V to 7 V by coupling due to the third capacitor C13. The third transistor M13 is turned on by the voltage of the fourth node N14, and the first clock signal SCLK1 with the on voltage of 5V is transferred to the output terminal OUT. The scan signal S[1] of the gate-on voltage of 5V is outputted through the output terminal OUT.

In a period of t15 to t16, the first clock signal SCLK1 and the second clock signal SCLK2 are applied with the off voltages, the third clock signal SCLK3 and the fourth clock signal SCLK4 are applied with the on voltages. In this case, the scan signal with the gate-on voltage of 5V of a second scan driving block 210_2 is applied to the second input signal input terminal INB as a second input signal. The seventh transistor M17 is turned on and the first power source voltage VGH is transferred to the first node N11. The voltage of the first node N11 becomes 5 V. The second transistor M12 is turned on, and the first power source voltage VGH is transferred to the second node N12. The voltage of the second node N12 becomes 5 V. The eighth transistor M18 is turned on, and the first power source voltage VGH is transferred to the third node N13. The voltage of the third node N13 becomes 5 V. The fifth transistor M15 is turned on by the third clock signal SCLK3, and the third power source voltage VGL2 of −10 V is transferred to the fourth node N14. The voltage of the fourth node N14 becomes −10 V. The third transistor M13 is turned off by the voltage of the fourth node N14. The fourth transistor M14 is turned on by the third clock signal SCLK3, and the second power source voltage VGL1 is transferred to the output terminal OUT. The scan signal S[1] of the gate-off voltage of −7 V is outputted through the output terminal OUT. In this case, the second power source voltage VGL1 is charged in the fourth capacitor C14.

In a period of t16 to t17, the first clock signal SCLK1 and the second clock signal SCLK2 are with the on voltage, and the third clock signal SCLK3 and the fourth clock signal SCLK4 are applied with the off voltage. Since the voltage of the first node N11 is 5 V and the second transistor M12 is maintained in the turned-off state, although the second clock signal SCLK2 is changed from −12 V to 5 V, the voltage of the second node N12 is maintained at 5 V. Since the voltage of the second node N12 is not changed, the voltage of the third node N13 is maintained at 5 V, and the voltage of the fourth node N14 is maintained at −10 V. The third transistor M13 is maintained in the turned-off state. The scan signal S[1] of the gate-off voltage of −7 V is continuously outputted through the output terminal OUT by the second power source voltage VGL1 stored in the fourth capacitor C14.

In a period after t17, whenever the third clock signal SCLK3 inputted to the third clock signal input terminal CLK3 is inputted with the on voltage, the voltage of the fourth node N14 is charged in the third capacitor C13 at −10 V and the voltage of the output terminal OUT is charged in the fourth capacitor C14 at −7 V. Accordingly, the scan signal S[1] of the gate-off voltage of −7 V is continuously outputted through the output terminal OUT.

In the second scan driving block 210_2, the fourth clock signal SCLK4 is inputted to the first clock signal input terminal CLK1, the third clock signal SCLK3 is inputted to the second clock signal input terminal CLK2, the second clock signal SCLK2 is inputted to the third clock signal input terminal CLK3, and the scan signal S[1] of the first scan driving block 210_1 is inputted to the first input signal input terminal IN. That is, a clock signal delayed by 1 period of the clock signal inputted to the first scan driving block 210_1 and the first input signal are inputted to the second scan driving block 210_2. Accordingly, the second scan driving block 210_2 is delayed by 1 period of the clock signal as compared with the first scan driving block 210_1 to output a scan signal S[2].

In this manner, the plurality of scan driving blocks 210_1, 210_2, 210_3, . . . output the scan signals S[1], S[2], S[3], . . . of the gate-on voltage in sequence.

Figure 5:
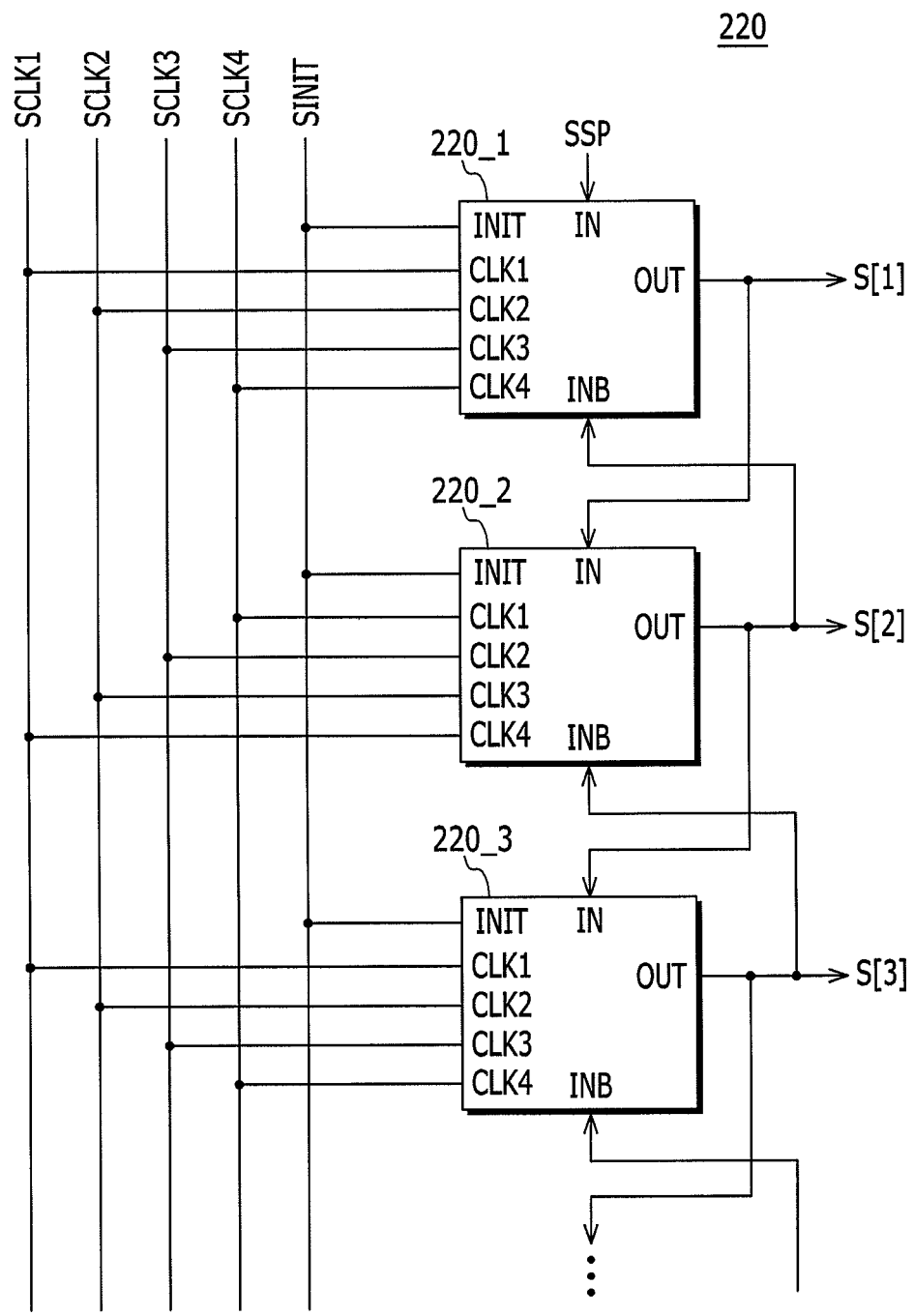
FIG. 5 is a block diagram illustrating an embodiment of the configuration of a scan driving device according.

FIG. 5 is a block diagram illustrating a configuration of an embodiment of scan driving device.

Referring to FIG. 5, a scan driving device 220 includes a plurality of scan driving blocks 220_1, 220_2, 220_3, . . . which are sequentially arranged. Each of the scan driving blocks 220_1, 220_2, 220_3, . . . receives an input signal to generate scan signals S[1], S[2], S[3], . . . transferred to a plurality of scan lines S1-Sn, respectively.

The plurality of scan driving blocks 220_1, 220_2, 220_3, . . . each includes an initial signal input terminal INIT, a first clock signal input terminal CLK1, a second clock signal input terminal CLK2, a third clock signal input terminal CLK3, a fourth clock signal input terminal CLK4, a first input signal input terminal IN, a second input signal input terminal INB, and an output terminal OUT.

An initial signal SINIT is inputted to the initial signal input terminal INIT of each of the plurality of scan driving blocks 220_1, 220_2, 220_3, . . . .

In the odd numbered scan driving blocks 220_1, 220_3, . . . , a first clock signal SCLK1 is inputted to the first clock signal input terminal CLK1, a second clock signal SCLK2 is inputted to the second clock signal input terminal CLK2, a third clock signal SCLK3 is inputted to the third clock signal input terminal CLK3, and a fourth clock signal SCLK4 is inputted to the fourth clock signal input terminal CLK4.

Further, in the even numbered scan driving blocks 220_2, ..., a fourth clock signal SCLK4 is inputted to the first clock signal input terminal CLK1, the third clock signal SCLK3 is inputted to the second clock signal input terminal CLK2, the second clock signal SCLK2 is inputted to the third clock signal input terminal CLK3, and the first clock signal SCLK1 is inputted to the fourth clock signal input terminal CLK4.

The output terminals OUT of the plurality of scan driving blocks 220_1, 220_2, 220_3, ... are connected to the plurality of scan lines S1-Sn. Each of the scan driving blocks 220_1, 220_2, 220_3, ... outputs, to the output terminal OUT, the scan signals S[1], S[2], S[3], ... which are generated according to signals inputted to the initial signal input terminal INIT, the plurality of clock signal input terminals CLK1, CLK2, CLK3, and CLK4, the first input signal input terminal IN, and the second input signal input terminal INB.

The scan start signal SSP is inputted to the first input signal input terminal IN of the first scan driving block 220_1. The scan signal outputted through output terminal OUT of a scan driving block is inputted to the first input signal input terminal IN of the next sequential scan driving blocks. For example, scan signal S[1] is inputted into the first input signal input terminal IN of scan driving block 220_2, and scan signal S[2] is inputted into the first input signal input terminal IN of scan driving block 220_3. In this way, the scan signal of odd numbered scan driving blocks is inputted to the first input signal input terminals IN of the next sequential even numbered scan driving blocks. and scan signals outputted through output terminals OUT of the even numbered scan driving blocks are inputted to the first input signal input terminals IN of the next sequential odd numbered scan driving blocks.

Scan signals outputted through output terminals OUT of scan driving blocks are inputted to the second input signal input terminals INB of the previously numbered scan driving block. For example, the scan signal S[2] is inputted in to the second input signal input terminal INB of scan driving block 220_1, and scan signal S[3] is inputted in to the second input signal input terminal INB of scan driving block 220_2. In this way, scan signals outputted through output terminals OUT of odd numbered scan driving blocks are inputted to the second input signal input terminals INB of immediately preceeding even numbered scan driving blocks and scan signals outputted through output terminals OUT of the even numbered scan driving blocks are inputted to the second input signal input terminals INB of the immediately preceeding odd numbered scan driving blocks.

Figure 6:
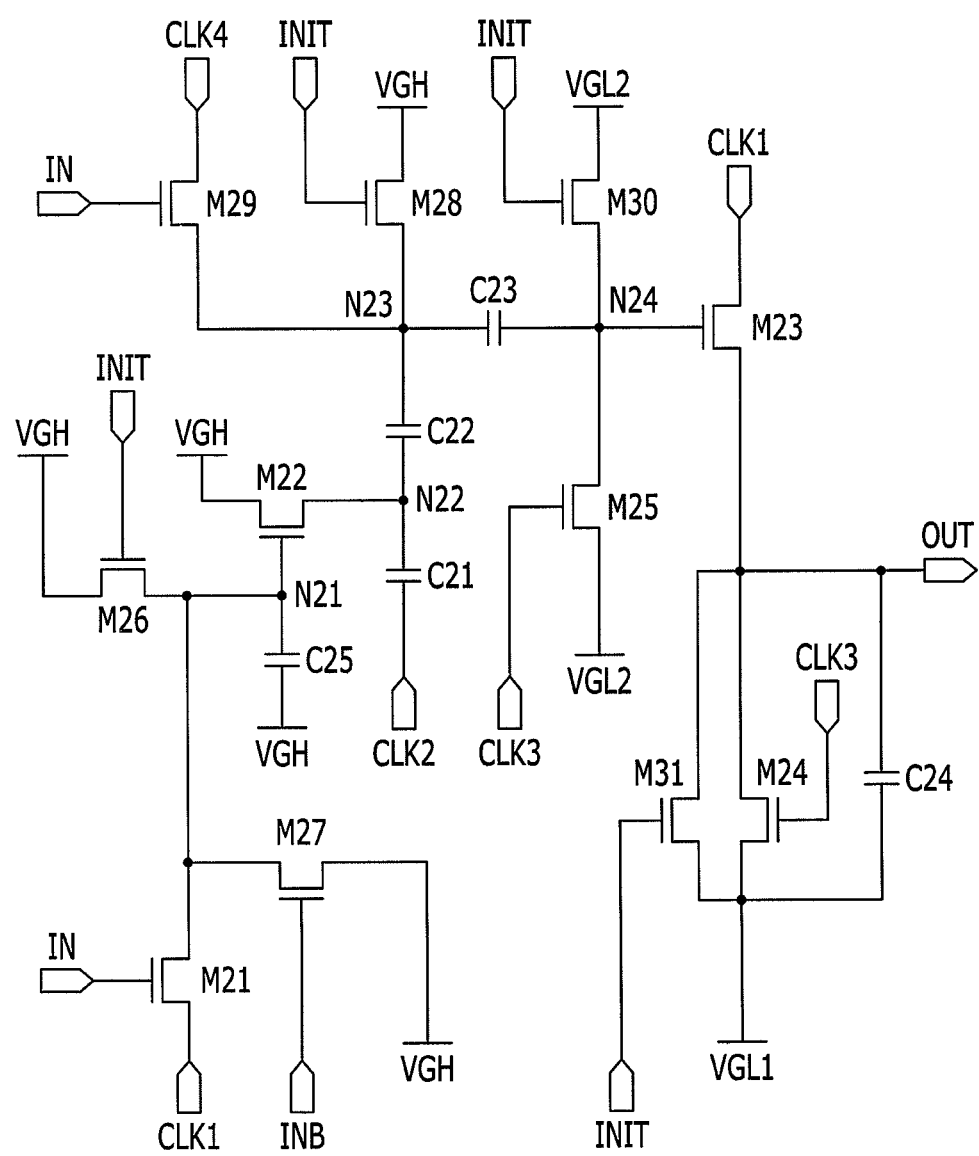
FIG. 6 is a circuit diagram illustrating a scan driving block included in the scan driving device of FIG. 5.

FIG. 6 is a circuit diagram illustrating a scan driving block according to the exemplary embodiment included in the scan driving device of FIG. 5.

Referring to FIG. 6, a scan driving block 220_k includes a plurality of transistors M21, M22, M23, M24, M25, M26, M27, M28, M29, M30, and M31 and a plurality of capacitors C21, C22, C23, C24, and C25.

A first transistor M21 includes a gate electrode connected to the first input signal input terminal IN, one electrode connected to the first clock signal input terminal CLK1, and the other electrode connected to a first node N21. The first transistor M21 transfers a clock signal inputted to the first clock signal input terminal CLK1 to the first node N21 according to a first input signal inputted to the first input signal input terminal IN.

A second transistor M22 includes a gate electrode connected to the first node N21, one electrode connected to a first power source voltage VGH, and the other electrode connected to a second node N22. The second transistor M22 transfers the first power source voltage VGH to the second node N22 according to a voltage of the first node N21.

A third transistor M23 includes a gate electrode connected to a fourth node N24, one electrode connected to the first clock signal input terminal CLK1, and the other electrode connected to the output terminal OUT. The third transistor M23 transfers the clock signal inputted to the first clock signal input terminal CLK1 to the output terminal OUT according to a voltage of the fourth node N24.

A fourth transistor M24 includes a gate electrode connected to the third clock signal input terminal CLK3, one electrode connected to a second power source voltage VGL1, and the other electrode connected to the output terminal OUT. The fourth transistor M24 transfers the second power source voltage VGL1 to the output terminal OUT according to a clock signal inputted to the third clock signal input terminal CLK3.

A fifth transistor M25 includes a gate electrode connected to the third clock signal input terminal CLK3, one electrode connected to a third power source voltage VGL2, and the other electrode connected to the fourth node N24. The fifth transistor M25 transfers the third power source voltage VGL2 to the fourth node N24 according to a clock signal inputted to the third clock signal input terminal CLK3.

A sixth transistor M26 includes a gate electrode connected to the initial signal input terminal INIT, one electrode connected to the first power source voltage VGH, and the other electrode connected to the first node N21. The sixth transistor M26 transfers the first power source voltage VGH to the first node N21 according to the initial signal SINIT inputted to the initial signal input terminal INIT.

A seventh transistor M27 includes a gate electrode connected to the second input signal input terminal INB, one electrode connected to the first power source voltage VGH, and the other electrode connected to the first node N21. The seventh transistor M27 transfers the first power source voltage VGH to the first node N21 according to the second input signal inputted to the second input signal input terminal INB.

A eighth transistor M28 includes a gate electrode connected to the initial signal input terminal INIT, one electrode connected to the first power source voltage VGH, and the other electrode connected to the third node N23. The eighth transistor M28 transfers the first power source voltage VGH to the third node N23 according to the initial signal SINIT inputted to the initial signal input terminal INIT.

A ninth transistor M29 includes a gate electrode connected to the first input signal input terminal IN, one electrode connected to the fourth clock signal input terminal CLK4, and the other electrode connected to the third node N23. The ninth transistor M29 transfers the clock signal inputted to the fourth clock signal input terminal CLK4 to the third node N23 according to the first input signal inputted to the first input signal input terminal IN.

A tenth transistor M30 includes a gate electrode connected to the initial signal input terminal INIT, one electrode connected to the third power source voltage VGL2, and the other electrode connected to the fourth node N24. The tenth transistor M30 transfers the third power source voltage VGL2 to the fourth node N24 according to the initial signal inputted to the initial signal input terminal INIT.

A eleventh transistor M31 includes a gate electrode connected to the initial signal input terminal INIT, one electrode connected to the second power source voltage VGL1, and the other electrode connected to the output terminal OUT. The eleventh transistor M31 transfers the second power source voltage VGL1 to the output terminal OUT according to the initial signal inputted to the initial signal input terminal INIT.

A first capacitor C21 includes one electrode connected to the second clock signal input terminal CLK2 and the other electrode connected to the second node N22. The first capacitor C21 changes the voltage of the second node N22 according to the clock signal inputted to the second clock signal input terminal CLK2.

A second capacitor C22 includes one electrode connected to the second node N22 and the other electrode connected to the third node N23. The second capacitor C22 changes the voltage of the third node N23 according to a voltage change of the second node N22.

A third capacitor C23 includes one electrode connected to the third node N23 and the other electrode connected to the fourth node N24. The third capacitor C23 changes the voltage of the fourth node N24 according to a voltage change of the third node N23.

A fourth capacitor C24 includes one electrode connected to the second power source voltage VGL1 and the other electrode connected to the output terminal OUT. The fourth capacitor C24 stores the voltage of the output signal outputted to the output terminal OUT.

A fifth capacitor C25 includes one electrode connected to the first power source voltage VGH and the other electrode connected to the first node N21. The fifth capacitor C25 stores the voltage of the first node N21.

The plurality of transistors M21, M22, M23, M24, M25, M26, M27, M28, M29, M30, and M31 may be N-type oxide thin film transistors. A gate-on voltage which turns on the N-type oxide thin film transistor is a logic high-level voltage, and a gate-off voltage which turns off the N-type oxide thin film transistor is a logic low-level voltage.

The first power source voltage VGH is a logic high-level voltage, the second power source voltage VGL1 is a logic low-level voltage, and the third power source voltage VGL2 is a logic low-level voltage, lower than the second power source voltage VGL1.

Figure 7:
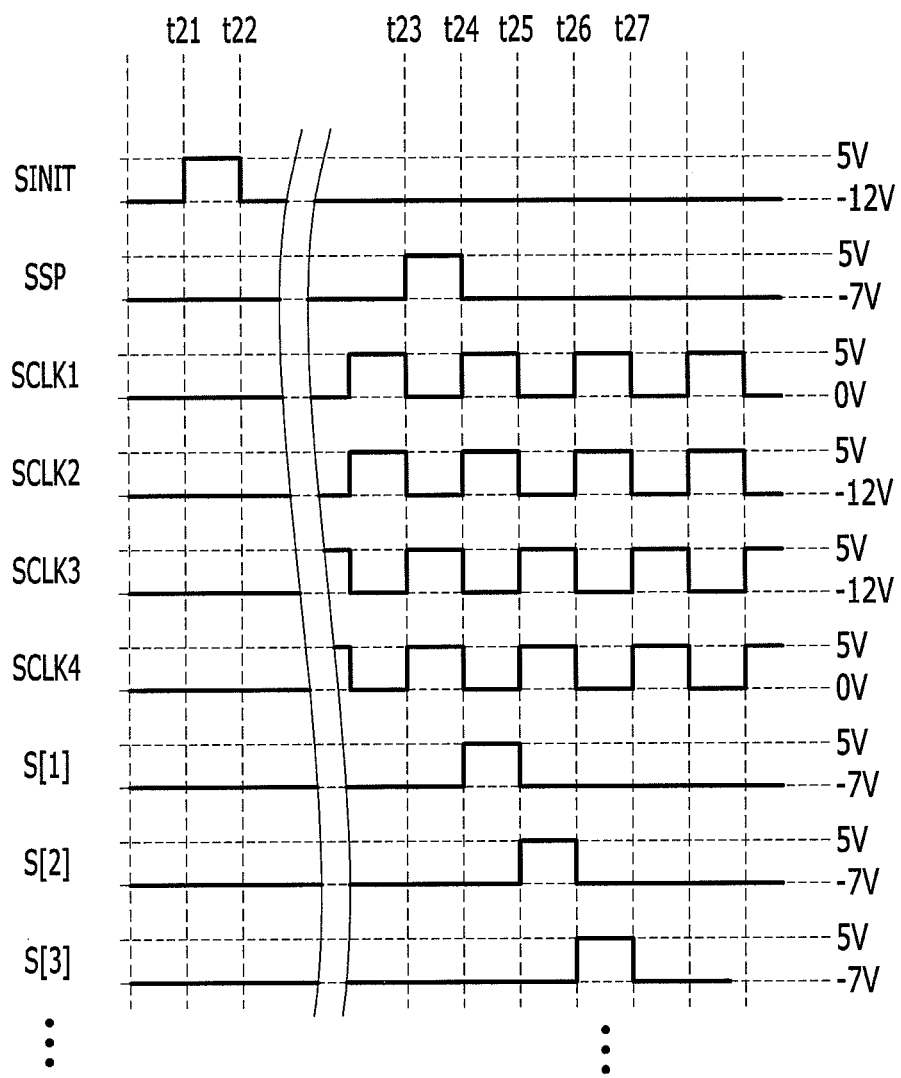
FIG. 7 is a timing diagram for the driving method of the scan driving device of FIG. 5.

FIG. 7 is a timing diagram for describing a driving method of the scan driving device of FIG. 5.

Referring to FIGS. 5 to 7, the scan driving device 220 is driven according to an initial period (period of t21 to t22) when a node voltage of each of the plurality of scan driving blocks 220_1, 220_2, 220_3, . . . is initialized, and a scan period (a period after t23) when the scan signals S[1], S[2], S[3], . . . of the gate-on voltage are outputted in sequence.

For convenience of the description, it is assumed that an on voltage of the initial signal SINT is 5 V and an off voltage thereof is −12 V, on voltages of the scan start signal SSP and the scan signals S[1], S[2], S[3], . . . are 5 V and off voltages thereof are −7 V, on voltages of the first clock signal SCLK1 and the fourth clock signal SCLK4 are 5 V and off voltages thereof are 0 V, and on voltages of the second clock signal SCLK2 and the third clock signal SCLK3 are 5 V and off voltages thereof are −12 V. Further, it is assumed that the first power source voltage VGH is 5 V, the second power source voltage VGL1 is −7 V, and the third power source voltage VGL2 is −10 V. A voltage range of each signal is not limited and may be changed according to a condition. These assumed voltages are merely exemplary, and are not intended to be limiting in any way. Other on and off voltages may be chosen based on the desired design and operation of the scan driving device and associated display.

In an initial period (period of t21 to t22), the initial signal SINIT is applied with the on voltage. The sixth transistor M26, the eighth transistor M28, the tenth transistor M30, and the eleventh transistor M31 are turned on. The first power source voltage VGH is transferred to the first node N21 through the turned-on sixth transistor M26. The second transistor M22 is turned on by the voltage of the first node N21, and the first power source voltage VGH is transferred to the second node N22. The first power source voltage VGH is transferred to the third node N23 through the turned-on eighth transistor M28. Voltages of the first node N21, the second node N22, and the third node N23 are initialized to 5 V. Further, the third power source voltage VGL2 is transferred to the fourth node N24 through the turned-on tenth transistor M30. The voltage of the fourth node N24 becomes −10 V and completely turns off the third transistor M23. The second power source voltage VGL1 is transferred to the output terminal OUT through the turned-on eleventh transistor M31, and the scan signal of the gate-off voltage of −7 V is outputted through the output terminal OUT. In this case, the second power source voltage VGL1 charges the fourth capacitor C24.

In the initial period (period of t21 to t22), since the initial signals SINIT are inputted to the initial signal input terminals INIT of the plurality of scan driving blocks 220_1, 220_2, 220_3, . . . at the same time, the plurality of scan driving blocks 220_1, 220_2, 220_3, . . . output the scan signals of the gate-off voltage of −7 V at the same time.

In a scan period (period after t23), the first clock signal SCLK1 and the second clock signal SCLK2 have the same cycle. In this case, the third clock signal SCLK3 is a signal shifted by the period of the second clock signal SCLK2, and the fourth clock signal SCLK4 is a signal shifted by the period of the first clock signal SCLK1. Further, the second clock signal SCLK2 has a voltage range larger than the first clock signal SCLK1, and the third clock signal SCLK3 has a voltage range larger than the fourth clock signal SCLK4. The initial signal SINIT for the scan period is maintained at an off voltage of −12 V.

First, an operation of a first scan driving block 220_1 will be described.

In a period of t23 to t24, the scan start signal SSP of the on voltage is applied to the first input signal input terminal IN as a first input signal. In this case, the first clock signal SCLK1 and the second clock signal SCLK2 are the off voltages, and the third clock signal SCLK3 and the fourth clock signal SCLK4 are the on voltages. As the scan start signal SSP of the on voltage is applied to the first input signal input terminal IN, the first transistor M21 is turned on and the first clock signal SCLK1 of 0 V is transferred to the first node N21. In this case, as the second clock signal SCLK2 is changed from 0 V to −12 V, the voltage of the second node N22 is lowered by −12 V by coupling due to the first capacitor C21, and finally, the second transistor M22 is turned on by a difference between gate-source voltages. The first power source voltage VGH is transferred to the second node N22 through the turned-on second transistor M22. The voltage of the second node N22 becomes 5V. The ninth transistor M29 is turned on by the scan start signal SSP, and the fourth clock signal SCLK4 of 5 V is transferred to the third node N23. The voltage of the third node N23 becomes 5 V. The voltage of the fourth node N24 is maintained at −10 V initialized in the initial period. The third transistor M23 is maintained in the completely turned-off state A scan signal S[1] of the gate-off voltage of −7 V is continuously outputted through the output terminal OUT by the second power source voltage VGL1 stored in the fourth capacitor C24.

In a period of t24 to t25, the first clock signal SCLK1 and the second clock signal SCLK2 are applied with the on voltages, and the third clock signal SCLK3 and the fourth clock signal SCLK4 are applied with the off voltages. As the second clock signal SCLK2 is changed from −12 V to 5 V, the voltage of the second node N22 is changed from 5 V to 22 V by coupling due to the first capacitor C21. As the voltage of the second node N22 is changed from 5 V to 22 V, the voltage of the third node N23 is changed from 5 V to 22 V by coupling due to the second capacitor C22. As the voltage of the third node N23 is changed from 5 V to 22 V, the voltage of the fourth node N24 is changed from −10 V to 7 V by coupling due to the third capacitor C23. The third transistor M23 is turned on by the voltage of the fourth node N24, and the first clock signal SCLK1 of the on voltage of 5V is transferred to the output terminal OUT. The scan signal S[1] of the gate-on voltage of 5V is outputted through the output terminal OUT.

In a period of t25 to t26, the first clock signal SCLK1 and the second clock signal SCLK2 are applied with the off voltages, the third clock signal SCLK3 and the fourth clock signal SCLK4 are applied with the on voltages. In this case, the scan signal of the gate-on voltage of 5V of a second scan driving block 220_2 is applied to the second input signal input terminal INB as a second input signal. The seventh transistor M27 is turned on, and the first power source voltage VGH is transferred to the first node N21. The voltage of the first node N21 becomes 5 V. The second transistor M22 is turned on, and the first power source voltage VGH is transferred to the second node N22. The voltage of the second node N22 is changed from 22 V to 5 V. As the voltage of the second node N22 is changed from 22 V to 5 V, the voltage of the third node N23 is changed from 22 V to 5 V. The fifth transistor M25 is turned on by the third clock signal SCLK3, and the third power source voltage VGL2 of −10 V is transferred to the fourth node N24. The voltage of the fourth node N24 becomes −10 V. The third transistor M23 is turned off by the voltage of the fourth node N24. The fourth transistor M24 is turned on by the third clock signal SCLK3, and the second power source voltage VGL1 is transferred to the output terminal OUT. The scan signal S[1] of the gate-off voltage of −7 V is outputted through the output terminal OUT. In this case, the second power source voltage VGL1 is charged in the fourth capacitor C24.

In a period of t26 to t27, the first clock signal SCLK1 and the second clock signal SCLK2 are applied with the on voltage, and the third clock signal SCLK3 and the fourth clock signal SCLK4 are applied with the off voltage. Since the voltage of the first node N21 is 5 V and the second transistor M22 is maintained in the turned-off state, although the second clock signal SCLK2 is changed from −12 V to 5 V, the voltage of the second node N22 is maintained at 5 V. Since the voltage of the second node N22 is not changed, the voltage of the third node N23 is maintained at 5 V, and the voltage of the fourth node N24 is maintained at −10 V. The third transistor M23 is maintained in the turned-off state. The scan signal S[1] of the gate-off voltage of −7 V is outputted through the output terminal OUT by the second power source voltage VGL1 stored in the fourth capacitor C24.

In a period after t27, whenever the third clock signal SCLK3 inputted to the third clock signal input terminal CLK3 is inputted with the on voltage, the voltage of the fourth node N24 is charged in the third capacitor C23 at −10 V and the voltage of the output terminal OUT is charged in the fourth capacitor C24 at −7 V. Accordingly, the scan signal S[1] of the gate-off voltage of −7 V is continuously outputted through the output terminal OUT.

In the second scan driving block 220_2, the fourth clock signal SCLK4 is inputted to the first clock signal input terminal CLK1, the third clock signal SCLK3 is inputted to the second clock signal input terminal CLK2, the second clock signal SCLK2 is inputted to the third clock signal input terminal CLK3, the first clock signal SCLK1 is inputted to the fourth clock signal input terminal CLK4, and the scan signal S[1] of the first scan driving block 220_1 is inputted to the first input signal input terminal IN. That is, a clock signal delayed by 1 period of the clock signal inputted to the first scan driving block 220_1 and the first input signal are inputted to the second scan driving block 220_2. Accordingly, the second scan driving block 220_2 is delayed by 1 period of the clock signal as compared with the first scan driving block 220_1 to output a scan signal S[2].

In this manner, the plurality of scan driving blocks 220_1, 220_2, 220_3, . . . outputs the scan signals S[1], S[2], S[3], . . . of the gate-on voltage in sequence.

The drawings referred to in the above and disclosed detailed description of the present disclosure are illustrative, and are not intended to restrict the meanings or limit the scope of the present description. Therefore, those skilled in the art can understand that various modifications and other equivalent exemplary embodiment may be made therefrom. Accordingly, the true technical protection scope of the present invention must be determined by the technical spirit of the accompanying claims.

What is claimed is:

1. A scan driving device comprising:
a plurality of scan driving blocks, and each of the plurality of scan driving blocks including:
    a first clock signal input terminal;
    a second clock signal input terminal;
    a first input signal input terminal;
    a second input signal input terminal;
    an output terminal;
    a scan line connected to the output terminal;
    a first transistor configured to transfer a first clock signal inputted to the first clock signal input terminal to a first node according to a first input signal inputted to the first input signal input terminal;
    a second transistor configured to transfer a first power source voltage to a second node according to a voltage of the first node;
    a first capacitor connected between the second node and the second clock signal input terminal configured to change a voltage of the second node according to a second clock signal inputted to the second clock signal input terminal;
    a second capacitor connected between the second node and a third node configured to change a voltage of the third node according to a voltage change of the second node;
    a third capacitor connected between the third node and a fourth node to change a voltage of the fourth node according to the voltage of the third node; and
    a third transistor configured to transfer the first clock signal inputted to the first clock signal input terminal to the output terminal connected to the scan line according to the voltage of the fourth node.

2. The scan driving device of claim 1, further comprising:
a second power source voltage;
a third clock signal input terminal;
a fourth transistor configured to transfer the second power source voltage to the output terminal according to a third clock signal inputted to the third clock signal input terminal.

3. The scan driving device of claim 2, further comprising:
a fourth capacitor connected between the output terminal and the second power source voltage to store a voltage of an output signal outputted to the output terminal.

4. The scan driving device of claim 3, further comprising:
a fifth transistor configured to transfer a third power source voltage to the fourth node according to the third clock signal inputted to the third clock signal input terminal.

5. The scan driving device of claim 4, further comprising a sixth transistor configured to transfer the first power source voltage to the first node according to an initial signal.

6. The scan driving device of claim 5, further comprising a seventh transistor configured to transfer the first power source voltage to the first node according to a second input signal inputted to the second input signal input terminal.

7. The scan driving device of claim 6, further comprising a fifth capacitor connected between the first node and the first power source voltage configured to store the voltage of the first node.

8. The scan driving device of claim 7, further comprising an eighth transistor configured to transfer the first power source voltage to the third node according to the third clock signal inputted to the third clock signal input terminal.

9. The scan driving device of claim 8, wherein at least one of the first transistor, the second transistor, the third transistor, the fourth transistor, the fifth transistor, the sixth transistor, the seventh transistor, and the eighth transistor is an N-type oxide thin film transistor.

10. The scan driving device of claim 9, wherein the first power source voltage is a logic high-level voltage, the second power source voltage is a logic low-level voltage, and the third power source voltage is a logic low-level voltage lower than the second power source voltage.

11. The scan driving device of claim 8, wherein the plurality of scan driving blocks comprises a first plurality of scan driving blocks and a second plurality of scan driving blocks, wherein, in the first plurality of scan blocks, the first clock signal is inputted to the first clock signal input terminal, the second clock signal is inputted to the second clock signal input terminal, and the third clock signal is inputted to the third clock signal input terminal; and
wherein, in the second plurality of scan driving blocks, a fourth clock signal is inputted to the first clock signal input terminal, the third clock signal is inputted to the second clock signal input terminal, and the second clock signal is inputted to the third clock signal input terminal.

12. The scan driving device of claim 11, wherein the output signal of one of the first plurality of scan driving blocks comprises the input to the first input signal input terminal of one of the second plurality of scan driving blocks, and the output signal of one of the second plurality of scan driving blocks comprises the input to the second input signal input terminal of one of the first plurality of scan driving blocks.

13. The scan driving device of claim 11, wherein the output signal of one of the second plurality of second scan driving blocks comprises, the input to the first input signal input terminal of one of the first plurality of scan driving blocks, and the output signal of one of the first plurality of scan driving blocks is inputted to the second input signal input terminal of one of second the plurality of scan driving blocks.

14. The scan driving device of claim 11, wherein the first clock signal and the second clock signal have the same cycle, the third clock signal is a signal shifted by a period of the second clock signal, and the fourth clock signal is a signal shifted by a period of the first clock signal.

15. The scan driving device of claim 14, wherein the second clock signal has a voltage range larger than the first clock signal, and the third clock signal has a voltage range larger than the fourth clock signal.

16. The scan driving device of claim 7, further comprising an eighth transistor configured to transfer the first power source voltage to the third node according to the initial signal.

17. The scan driving device of claim 16, further comprising:
a fourth clock signal input terminal; and
a ninth transistor configured to transfer a fourth clock signal inputted to the fourth clock signal input terminal to the third node according to the first input signal inputted to the first input signal input terminal.

18. The scan driving device of claim 17, further comprising a tenth transistor configured to transfer the third power source voltage to the fourth node according to the initial signal.

19. The scan driving device of claim 18, further comprising an eleventh transistor configured to transfer the second power source voltage to the output terminal according to the initial signal.

20. The scan driving device of claim 19, wherein:
at least one of the first transistor, the second transistor, the third transistor, the fourth transistor, the fifth transistor, the sixth transistor, the seventh transistor, the eighth transistor, the ninth transistor, the tenth transistor, and the eleventh transistor is an N-type oxide thin film transistor.

21. The scan driving device of claim 20, wherein:
the first power source voltage is a logic high-level voltage, the second power source voltage is a logic low-level voltage, and the third power source voltage is a logic low-level voltage lower than the second power source voltage.

22. The scan driving device of claim 19, wherein the plurality of scan driving blocks comprises a first plurality of scan driving blocks and a second plurality of scan driving blocks, wherein in the plurality of first scan driving blocks, the first clock signal is inputted to the first clock signal input terminal, the second clock signal is inputted to the second clock signal input terminal, the third clock signal is inputted to the third clock signal input terminal, and the fourth clock signal is inputted to the fourth clock signal input terminal, and wherein, in the second plurality of scan driving blocks, the fourth clock signal is inputted to the first clock signal input terminal, the third clock signal is inputted to the second clock signal input terminal, the second clock signal is inputted to the third clock signal input terminal, and the first clock signal is inputted to the fourth clock signal input terminal.

23. The scan driving device of claim 22, wherein the output signal of one of the first plurality of scan driving blocks comprises the input to the first input signal input terminal of one of the second plurality of scan driving blocks, and the output signal of one of the second plurality of scan driving blocks comprises the input to the second input signal input terminal of one of the first plurality of scan driving blocks.

24. The scan driving device of claim 22, wherein the output signal of one of the second plurality of second scan driving blocks comprises, the input to the first input signal input terminal of one of the first plurality of scan driving blocks, and the output signal of one of the first plurality of scan driving blocks is inputted to the second input signal input terminal of one of second the plurality of scan driving blocks.

25. The scan driving device of claim 22, wherein the first clock signal and the second clock signal have the same cycle, the third clock signal is a signal shifted by a period of the second clock signal, and the fourth clock signal is a signal shifted by a period of the first clock signal.

26. The scan driving device of claim 25, wherein the second clock signal has a voltage range larger than the first clock signal, and the third clock signal has a voltage range larger than the fourth clock signal.

27. A method of driving a scan driving device comprising:
providing a plurality of scan driving blocks each of which includes a first transistor transferring a clock signal inputted to a first clock signal input terminal to a first node, a second transistor having a gate electrode connected to the first node to transfer a first power source voltage of an on voltage to a second node, a first capacitor connected between the second node and a second clock signal input terminal, a second capacitor connected between the second node and a third node, a third capacitor connected between the third node and a fourth node; and a third transistor having a gate electrode connected to the fourth node to transfer the clock signal inputted to the first clock signal input terminal to an output terminal connected to a scan line; applying the first power source voltage to the first node, the second node, and the third node;
applying a third power source voltage having an off voltage to the fourth node; and
outputting a second power source voltage having an off voltage through the output terminal.

28. The driving method of a scan driving device of claim 27, wherein the outputting of the second power source voltage of the off voltage through the output terminal includes turning on a fourth transistor according to a clock signal inputted to a third clock signal input terminal connected to a gate electrode of the fourth transistor, thereby transferring the second power source voltage to the output terminal.

29. The driving method of a scan driving device of claim 28, wherein the applying of the third power source voltage having an off voltage to the fourth node includes turning on a fifth transistor according to a clock signal inputted to a third clock signal input terminal connected to a gate electrode of the fifth transistor, thereby transferring the third power source voltage to the fourth node.

30. The driving method of a scan driving device of claim 29, wherein the applying of the first power source voltage to the first node, the second node, and the third node includes:
turning on the first transistor according to a first input signal inputted to a first input signal input terminal connected to a gate electrode of the first transistor;
turning on the second transistor by changing a voltage of the second node according to a voltage change of a clock signal inputted to the second clock signal input terminal; and
turning on an eighth transistor according to a clock signal inputted to a third clock signal input terminal connected to a gate electrode of the eighth transistor transferring the first power source voltage to the third node.

31. The driving method of a scan driving device of claim 30, further comprising:
outputting a clock signal having an on voltage through the output terminal, as a clock signal inputted to the first clock signal input terminal and a clock signal inputted to the second clock signal input terminal are changed to the on voltages, and a clock signal inputted to the third clock signal input terminal is changed to the off voltage.

32. The driving method of a scan driving device of claim 31, wherein the outputting of the clock signal inputted to the first clock signal input terminal through the output terminal includes:
changing the voltage of the second node as the clock signal inputted to the second clock signal input terminal is changed to the on voltage;
changing the voltage of the third node as the voltage of the second node is changed; and
changing the voltage of the fourth node to the on voltage as the voltage of the third node is changed.

33. The driving method of a scan driving device of claim 32, further comprising:
turning on a seventh transistor according to a second input signal inputted to the second input signal input terminal connected to a gate electrode of the seventh transistor transferring the first power source voltage to the first node; and
turning on the fourth transistor and the fifth transistor according to a clock signal inputted to the third clock signal input terminal and outputting the second power source voltage through the output terminal.

34. The driving method of a scan driving device of claim 27, wherein the applying of the first power source voltage to the first node, the second node, and the third node includes:
turning on a sixth transistor according to an initial signal inputted to a gate electrode of the sixth transistor transferring the first power source voltage to the first node; and
turning on an eighth transistor according to a clock signal inputted to a third clock signal input terminal connected to a gate electrode of the eighth transistor transferring the first power source voltage to the third node.

35. The driving method of a scan driving device of claim 27, wherein the applying of the first power source voltage to the first node, the second node, and the third node includes:
turning on a sixth transistor according to an initial signal inputted to a gate electrode of the sixth transistor transferring the first power source voltage to the first node; and
turning on an eighth transistor according to an initial signal inputted to a gate electrode of the eighth transistor transferring the first power source voltage to the third node.

36. The driving method of a scan driving device of claim 35, wherein the applying of the third power source voltage of the off voltage to the fourth node includes turning on a tenth transistor according to an initial signal inputted to a gate electrode of the tenth transistor transferring the third power source voltage to the fourth node.

37. The driving method of a scan driving device of claim 36, wherein the outputting of the second power source voltage of the off voltage through the output terminal includes turning on an eleventh transistor according to an initial signal inputted to a gate electrode of the eleventh transistor transferring the second power source voltage to the output terminal.

* * * * *